United States Patent
Ogawa et al.

(10) Patent No.: US 6,756,238 B2
(45) Date of Patent: Jun. 29, 2004

(54) DOMAIN CONTROLLED PIEZOELECTRIC SINGLE CRYSTAL AND FABRICATION METHOD THEREFOR

(75) Inventors: Toshio Ogawa, Fukuroi (JP); Mitsuyoshi Matsushita, Chiba (JP); Yoshihito Tachi, Chiba (JP)

(73) Assignee: Kawatetsu Mining Co., Ltd., Tokyo (JP)

(*) Notice: Subject to any disclaimer, the term of this patent is extended or adjusted under 35 U.S.C. 154(b) by 0 days.

(21) Appl. No.: 10/246,400

(22) Filed: Sep. 19, 2002

(65) Prior Publication Data

US 2003/0178914 A1 Sep. 25, 2003

(30) Foreign Application Priority Data

Mar. 25, 2002 (JP) ........................................ 2002-083702

(51) Int. Cl.[7] ........................ H01L 21/00; H01L 21/302; H01L 21/461
(52) U.S. Cl. ................................ 438/3; 438/4; 438/29; 438/30; 438/674; 438/689; 438/706
(58) Field of Search ........................... 438/3, 4, 29, 30, 438/674, 689, 706

(56) References Cited

U.S. PATENT DOCUMENTS 5,998,910 A * 12/1999 Park et al. .................. 310/358
6,238,481 B1 * 5/2001 Yamashita et al. ............ 117/84

FOREIGN PATENT DOCUMENTS

JP        A 6-38963        2/1994

OTHER PUBLICATIONS

"The Tenth US–Japan Seminar on Dielectric and Piezoelectric Ceramics" USA, Sep. 26–29, 2001.

* cited by examiner

Primary Examiner—Matthew Smith
Assistant Examiner—Igwe U. Anya
(74) Attorney, Agent, or Firm—Oliff & Berridge, PLC

(57) ABSTRACT

A domain controlled piezoelectric single crystal is disclosed which uses a lateral vibration mode for an electromechanical coupling factor $k_{31}$ not less than 70% and a piezoelectric constant $-d_{31}$ not less than 1200 pC/N, with an electromechanical coupling factor $k_{33}$ in the longitudinal vibration mode not less than 80% and a piezoelectric constant $d_{33}$ not less than 800 pC/N. Also, a piezoelectric single crystal is disclosed which uses a high-performance longitudinal vibration mode with $k_{31}$ not more than 30%. A fabrication method applies a DC electric field of 400 V/mm to 1500 V/mm for a maximum of two hours in a temperature range of 20° C. to 200° C. as polarization conditions in the thickness direction of the piezoelectric single crystal. The method can include cooling, or heating and cooling between temperature boundaries of rhombohedral and tetragonal crystals or between tetragonal and cubic crystals or within a cubic crystal temperature range.

4 Claims, 13 Drawing Sheets

250V/mm

500V/mm

700V/mm

1000V/mm

1600 V/mm

DOMAIN CONTROLLED PIEZOELECTRIC SINGLE CRYSTAL AND FABRICATION METHOD THEREFOR

BACKGROUND OF THE INVENTION

1. Field of the Invention

The present invention relates to a piezoelectric single crystal and a fabrication method therefor. More particularly, the invention relates to a piezoelectric single crystal which is developed paying attention to an electromechanical coupling factor in a direction perpendicular to the polarization direction, i.e., a lateral vibration mode, and domain control in that direction, and a fabrication method therefor.

2. Description of the Related Art

With regard to a piezoelectric single crystal, for example, Japanese Patent Laid-Open No. 38963/1994 discloses an ultrasonic probe using a piezoelectric material comprised of a solid solution single crystal of lead zinc niobate-lead titanate. This technique provides a probe with a high sensitivity by using that single crystal of such a piezoelectric material which has an electromechanical coupling factor ($k_{33}$) of 80 to 85% in a direction parallel to the polarization direction. While the electromechanical coupling factors in the direction parallel to the polarization direction of piezoelectric single crystals have been studied and various usages have been developed conventionally, the characteristics in a direction perpendicular to the polarization direction have not been studied yet.

The present inventors paid attention to the facts that a piezoelectric single crystal is adapted to multifarious usages for the electromechanical coupling factor ($k_{33}$) in a direction parallel to the polarization direction (longitudinal vibration mode) of the piezoelectric single crystal has a value equal to or greater than 80%, the electromechanical coupling factor ($k_{31}$) in a direction perpendicular to the polarization direction (lateral (=length extensional) vibration mode) is, for example, 49% to 62%, lower than the electromechanical coupling factor $k_{33}$ in the direction parallel to the polarization direction (longitudinal vibration mode), as described in pp. 239 in IEEE Proc. MEDICAL IMAGING 3664 (1999) and other documents, and that the electromechanical coupling factor $k_{31}$ takes a value that varies from one document to another. Through intensive studies on the phenomenon, the inventors discovered that it would be possible to fabricate a piezoelectric single crystal and their devices which would effectively use the electromechanical coupling factor $k_{31}$ in case where the electromechanical coupling factor $k_{33}$ in the direction parallel to the polarization direction (longitudinal vibration mode) was equal to or greater than 80%, a piezoelectric constant $d_{33}$ was equal to or greater than 800 pC/N, the electromechanical coupling factor $k_{31}$ was equal to or greater than 70% and a piezoelectric constant $-d_{31}$ was equal to or greater than 1200 pC/N ($d_{31}$ having a negative value by definition), and would be possible to fabricate a piezoelectric single crystal and their devices which would use the value of $k_{33}$ more efficiently due to generation of no spurious (undesired vibration) or the like in the band of usage of that value in case where $k_{33}$ was equal to or greater than 80%, $d_{33}$ was equal to or greater than 800 pC/N, $k_{31}$ was equal to or smaller than 30% and $-d_{31}$ was equal to or smaller than 300 pC/N ($d_{31}$ having a negative value by definition).

Further, the inventors discovered that the cause for the piezoelectric single crystal to have an intermediate electromechanical coupling factor $k_{31}$ in the direction perpendicular to the polarization direction (lateral vibration mode) and to have a variation in the factor while having a large electromechanical coupling factor $k_{33}$ in the direction parallel to the polarization direction (longitudinal vibration mode) was that the domain structure formed by an electric dipole associated with the direction perpendicular to the polarization direction of a polarized piezoelectric single crystal was formed by plural domains (multiple domains), not a single domain, and that the following piezoelectric single crystals (A) and (B) were obtained by controlling the domain structure.

(A) A domain controlled piezoelectric single crystal having an electromechanical coupling factor $k_{33} \geq 80\%$ in the longitudinal vibration mode and a piezoelectric constant $d_{33} \geq 800$ pC/N, comprising an electromechanical coupling factor $k_{31} \geq 70\%$ in a lateral vibration mode, a piezoelectric constant $-d_{31} \geq 1200$ pC/N and a frequency constant $fc_{31}$ (=fr·L)$\leq 650$ Hz·m which is a product of a resonance frequency fr in the lateral vibration mode relating to $k_{31}$ and a length L of the piezoelectric single crystal in a vibration direction.

(B) A domain controlled piezoelectric single crystal having an electromechanical coupling factor $k_{33}24$ 80% in a longitudinal vibration mode and a piezoelectric constant $d_{33} \geq 800$ pC/N, comprising an electromechanical coupling factor $k_{31} \leq 30\%$ in a lateral vibration mode in a direction perpendicular to the polarization direction, a piezoelectric constant $-d_{31} \leq 300$ pC/N and a frequency constant $fc_{31}$ (=fr·L)$\geq 800$ Hz·m which is a product of a resonance frequency fr in the lateral vibration mode relating to $k_{31}$ and a length L of the piezoelectric single crystal in a vibration direction.

The inventors also found that the conditions for controlling the domain structure were rearranged based on the value of a frequency constant $fc_{31}$ (=fr·L), which is a product of the resonance frequency fr in the lateral vibration mode relating to $k_{31}$ and the length L of the piezoelectric single crystal in the vibration direction.

The invention aims at providing such a piezoelectric single crystal and a fabrication method therefor.

SUMMARY OF THE INVENTION

According to the first aspect of the invention, there is provided a domain controlled piezoelectric, single crystal having an electromechanical coupling factor $k_{33} \geq 80\%$ in a longitudinal vibration mode and a piezoelectric constant $d_{33} \geq 800$ pC/N, comprising an electromechanical coupling factor $k_{31} \geq 70\%$ in a lateral vibration mode, a piezoelectric constant $-d_{31} \geq 1200$ pC/N ($d_{31}$ has a negative value by definition) and a frequency constant $fc_{31}$ (=fr·L)$\leq 650$ Hz·m which is a product of a resonance frequency fr in the lateral vibration mode relating to $k_{31}$ and a length L of the piezoelectric single crystal in a vibration direction.

According to the second aspect of the invention, there is provided a domain controlled piezoelectric single crystal having an electromechanical coupling factor $k_{33} \geq 80\%$ in a longitudinal vibration mode and a piezoelectric constant $d_{33} \geq 800$ pC/N, comprising an electromechanical coupling factor $k_{31} \leq 30\%$ in a lateral vibration mode, a piezoelectric constant $-d_{31} \leq 300$ pC/N ($d_{31}$ has a negative value by definition) and a frequency constant $fc_{31}$ (=fr·L) $\geq 800$ Hz·m which is a product of a resonance frequency fr in the lateral vibration mode relating to $k_{31}$ and a length L of the piezoelectric single crystal in a vibration direction.

The lengthwise direction of, for example, a rod-like piezoelectric single crystal with an aspect ratio of 3 or greater is the polarization direction and the vibration in the direction parallel to the polarization direction (longitudinal vibration) when a voltage is applied in the polarization direction and the efficiency of conversion between electrical and mechanical energy are respectively expressed by the electromechanical coupling factor $k_{33}$ in longitudinal vibration mode and the piezoelectric constant $d_{33}$. The greater those values are, the higher the efficiency is. Those values are also defined for piezoelectric single crystals with other shapes, such as a plate and a disc shape, besides the rod-like one. The invention pertains to a domain controlled piezoelectric single crystal developed paying attention to the electromechanical coupling factor $k_{31}$ in the direction perpendicular to the polarization direction (lateral vibration mode).

It is possible to use the following materials as the piezoelectric single crystal material according to the first aspect of the invention or the second aspect of the invention.

(a) A solid solution which is comprised of X·Pb $(A_1, A_2, \ldots, B_1, B_2, \ldots)O_3+(1-X)PbTiO_3(0<X<1)$ where $A_1, A_2, \ldots$ are one or plural elements selected from a group of Zn, Mg, Ni, Lu, In and Sc and $B_1, B_2, \ldots$ are one or plural elements selected from a group of Nb, Ta, Mo and W, and in which a sum ω of valencies of elements in parentheses in a chemical formula $Pb(A_{1Y1}{}^{a1}, A_{2Y2}{}^{a2}, \ldots, B_{1Z1}{}^{b1}, B_{1Z2}{}^{b2}, \ldots)O_3$ satisfies charges of $\omega=a_1 \cdot Y_1+a_2 \cdot Y_2+\ldots b_1 \cdot Z_1+b_2 \cdot Z_2+\ldots =4+$ where $a_1, a_2, \ldots$ are valencies of $A_1, A_2, \ldots$, $b_1, b_2, \ldots$ are valencies of $B_1, B_2, \ldots$ and $Z_1, Z_2, \ldots$ are composition ratios in the chemical formula.

(b) The material (a) added with 0.5 ppm to 1% by mass of one or two of Mn and Cr.

The best known materials are piezoelectric single crystal materials comprised of solid solutions of lead zinc niobate $Pb(Zn_{1/3}Nb_{2/3})O_3$ or lead magnesium niobate $Pb(Mg_{1/3}Nb_{2/3})O_3$ and lead titanate $PbTiO_3$ (the former combination is called "PZN-PT" or "PZNT" and the latter one "PMN-PT" or "PMNT").

The following are methods of fabricating the above-described domain controlled piezoelectric single crystals.

The first one is a piezoelectric single crystal fabricating method of fabricating a domain controlled piezoelectric single crystal, comprising a step of applying a DC electric field of 400 V/mm to 1500 V/mm for a maximum of two hours in a temperature range of 20° C. to 200° C. as polarization conditions in a thickness direction of the piezoelectric single crystal or a step of cooling while applying an electric field (field applied cooling).

While this method performs final polarization of a domain controlled piezoelectric single crystal device such as actuators, sensors and transducers, it is effective to employ a piezoelectric single crystal device such as actuators, sensors and transducers fabricating method which, prior to the final polarization step, additionally comprises a step of applying an electric field in a direction perpendicular to the polarization direction of a piezoelectric single crystal and a step of controlling a direction of a ferroelectric domain perpendicular to the polarization direction. The types of electric fields to be applied in the direction perpendicular to the polarization direction include steady electric fields, such as a DC electric field, a pulse electric field and an AC electric field, and an attenuating electric field. There are different proper conditions for the intensities of the electric fields, the application times, temperatures and so forth depending on the characteristics of each piezoelectric single crystal and the desired value of the electromechanical coupling factor $k_{31}$ in the direction perpendicular to the polarization direction. Those conditions can be determined by experiments, etc. As the pulse electric field, a unipolar pulse, such as a rectangular wave, and a bipolar pulse, such as an (AC) triangular wave can be used.

Another method of the invention is characterized by heating and cooling a piezoelectric single crystal before a step of final polarization of a domain controlled piezoelectric single crystal, which applies a DC electric field of 400 V/mm to 1500 V/mm for a maximum of two hours in a temperature range of 20° C. to 200° C. or performs cooling while applying an electric field (field applied cooling). For example, the temperature ranges for a piezoelectric single crystal to become rhombohedral, tetragonal and cubic are determined in accordance with the composition. Therefore, as a step (1) of heating and cooling a piezoelectric single crystal material with a temperature of transition between a rhombohedral crystal which is in a low temperature phase of the piezoelectric single crystal and a tetragonal crystal which is in an intermediate temperature phase of the piezoelectric single crystal material in between, or a step (2) of heating and cooling the piezoelectric single crystal material between a Curie temperature $T_c$ (the piezoelectric single crystal material becomes cubic over the $T_c$ with the disappearance of the ferroelectricity) and a rhombohedral crystal in the low temperature phase or a tetragonal crystal in the intermediate temperature phase, or a step (3) of heating and cooling the piezoelectric single crystal material in a temperature range of a cubic crystal which is in a high temperature phase equal to or higher than the $T_c$, or a step (4) of adequately combining the steps (1),(2) and (3) is executed followed by a step of applying a DC electric field of 400 V/mm to 1500 V/mm for a maximum of two hours in a temperature range of 20° C. to 200° C. or performing cooling while applying an electric field, it is possible to control the aligned state of ferroelectric domains perpendicular to the polarization direction.

Further, before a step of applying a DC electric field of 400 V/mm to 1500 V/mm for a maximum of two hours in a temperature range of 20° C. to 200° C. or performing cooling while applying an electric field, a step of applying an electric field in a direction perpendicular to the polarization direction of a piezoelectric single crystal and a step of heating and cooling the piezoelectric single crystal are used together, followed by a step of applying a DC electric field of 400 V/mm to 1500 V/mm for a maximum of two hours in a temperature range of 20° C. to 200° C. or performing cooling while applying an electric field, it is possible to control the aligned state of ferroelectric domains perpendicular to the polarization direction.

DETAILED DESCRIPTION OF THE PREFERRED EMBODIMENTS

Figure 1:
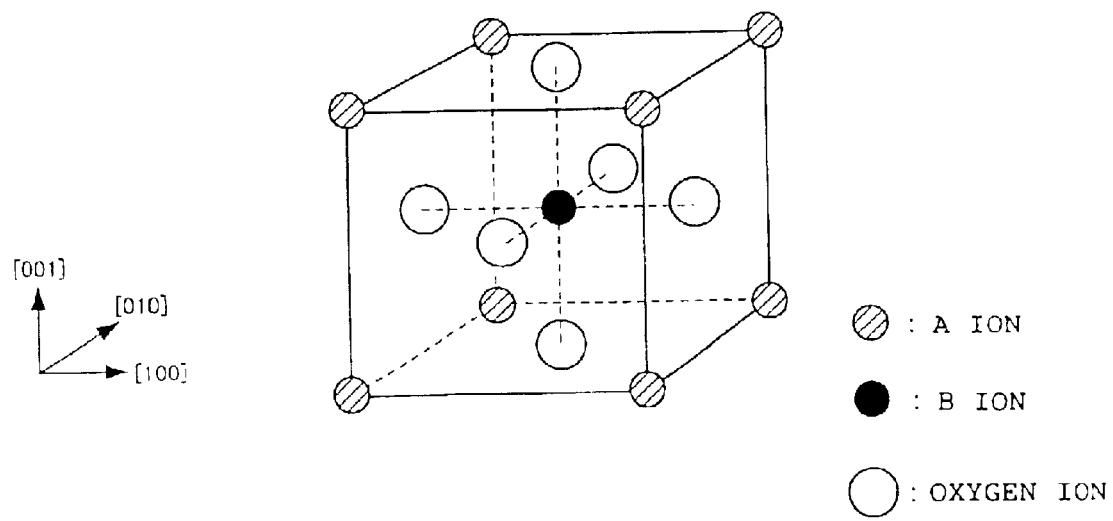
FIG. 1 is an exemplary perspective view of a crystal structure.
Figure 2:
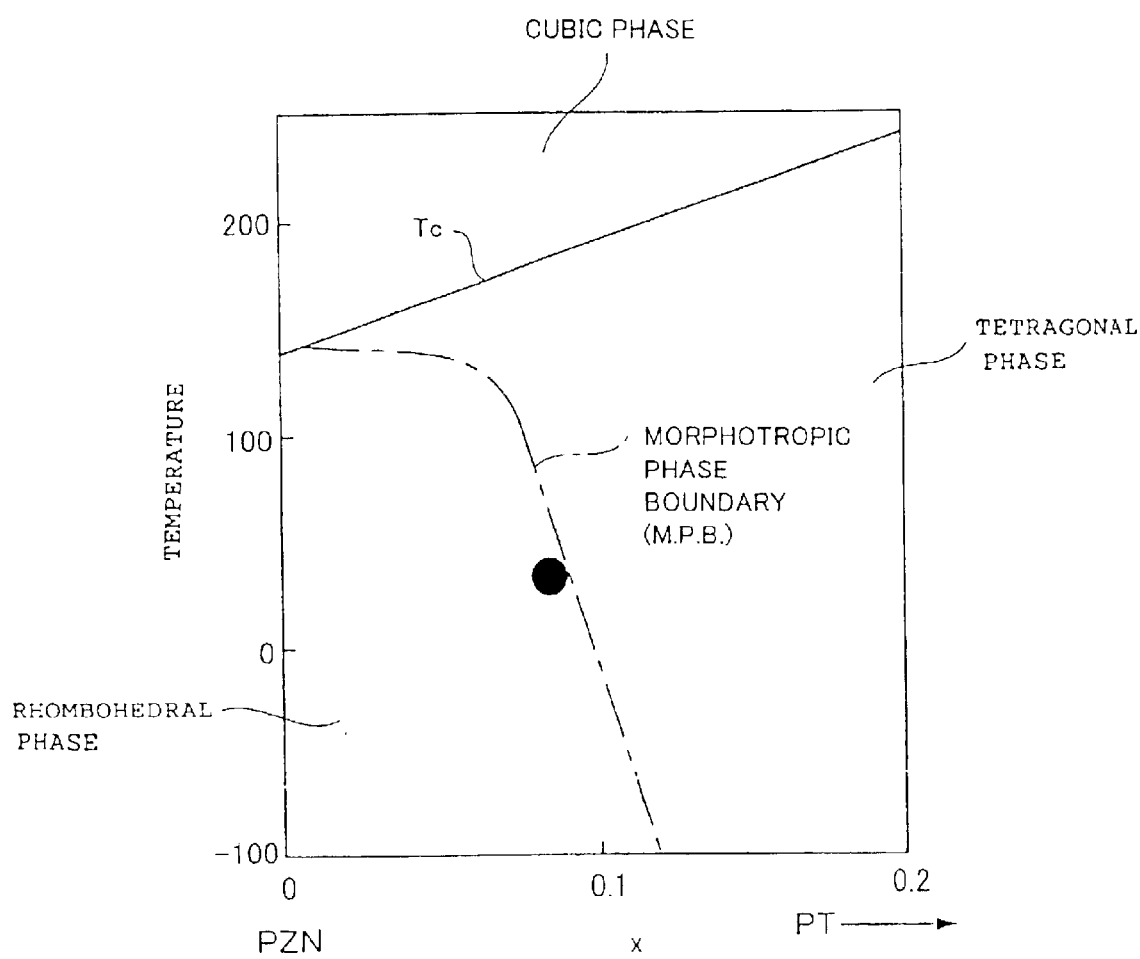
FIG. 2 is a phase diagram of PZN-PT (PZNT)

For example, the unit lattice of the solid solution single crystal of lead zinc niobate-lead titanate (PZN-PT or PZNT) has a perovskite structure ($ABO_3$) as exemplarily shown in FIG. 1. FIG. 2 presents a phase diagram of PZN and PT. This diagram is picked up from Nomura et al., J. Phys. (1969), or J. Kuwata et al., Ferroelectrics (1981). As seen from FIG. 2, rhombohedral PZNT has a spontaneous polarization equivalent to an electric bipolar in eight directions of the orientation <111> of a crystal when it is seen as a pseudo cubic. When an electric field is applied in the direction <100> (crystal cutting direction) in such a spontaneous polarization state, the electric bipolar rotates in the direction of applying a polarization electric field so that the spontaneous polarization directions are aligned.

However, it was found that the alignment took various states depending on the mode of applying the electric field, resulting in that although the electromechanical coupling factor $k_{33}$ in the direction parallel to the polarization direction had a value equal to or greater than 80%, the electromechanical coupling factor $k_{31}$ in the direction perpendicular to the polarization direction was distributed with a variation of 49 to 62% as described in the documents or the like, i.e., that with respect to the direction perpendicular to the polarization direction (lateral vibration mode), the electromechanical coupling factor $k_{31}$ was not controlled. With such a value of $k_{31}$, it was difficult to prepare a device positively using $k_{31}$. Also with such a value of $k_{31}$, a piezoelectric single crystal positively using $k_{33}$ had many responses called spurious generated in the longitudinal vibration ($k_{33}$) mode in the direction of parallel to the polarization direction, so that sufficient characteristics could not obtained. The factors that would give such results are explained as follows. In the material of the piezoelectric single crystal cut out of the piezoelectric single crystal after its as grown state, the domains comprised of a set of electric bipolars of the same direction face various directions in the direction parallel to the polarization direction and the direction perpendicular to the polarization direction, and do not show a piezoelectricity and are in an unpolarized state.

Multi domains cannot be aligned in the direction parallel to the polarization direction unless an ordinary polarization temperature and applied voltage are selected and an electric field is applied in the direction parallel to the polarization direction. Accordingly, the electromechanical coupling factor $k_{33}$ in the polarization direction shows a large value equal to or greater than 80%. However, the states of the domains in the direction perpendicular to the polarization direction can be controlled only under the polarization conditions in the direction parallel to the polarization direction, i.e., only within the adequate ranges of the polarization temperature and the applied voltage.

Figure 3:
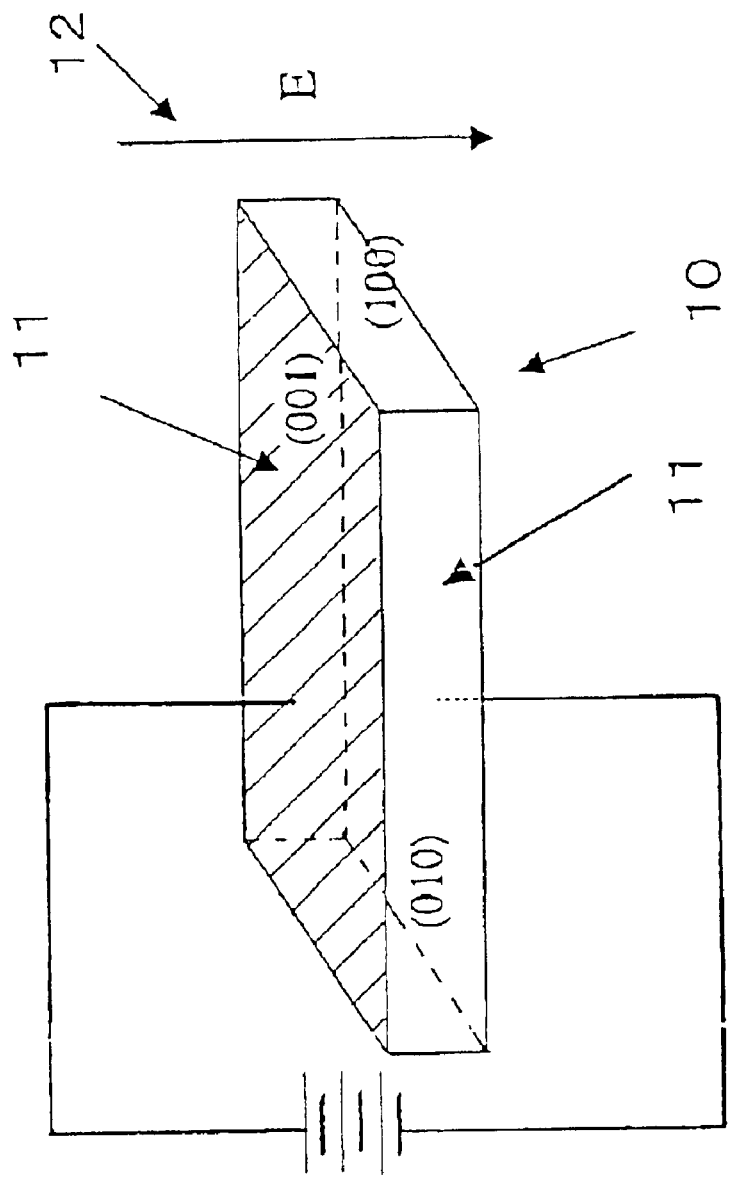
FIG. 3 is an explanatory diagram of application of an electric field.
Figure 4:
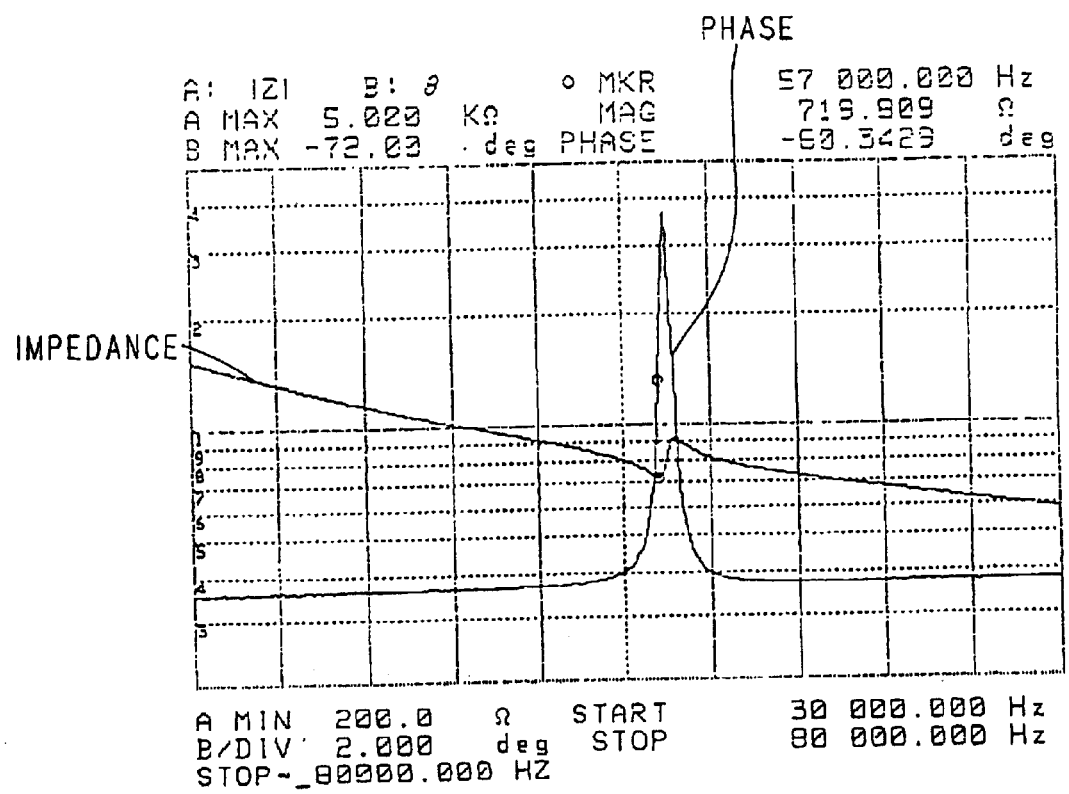
FIG. 4 is a diagram of an impedance curve and phase in $k_{31}$ vibration mode.
Figure 5:
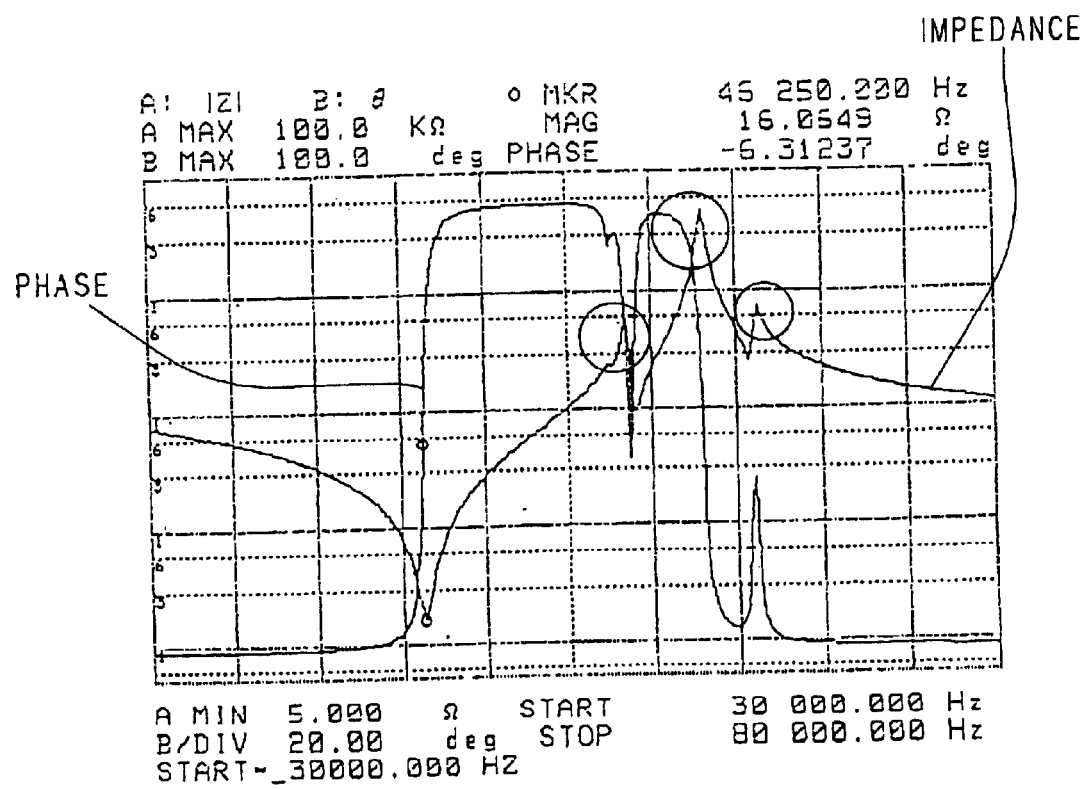
FIG. 5 is a diagram of an impedance curve and phase in $k_{31}$ vibration mode.
Figure 6:
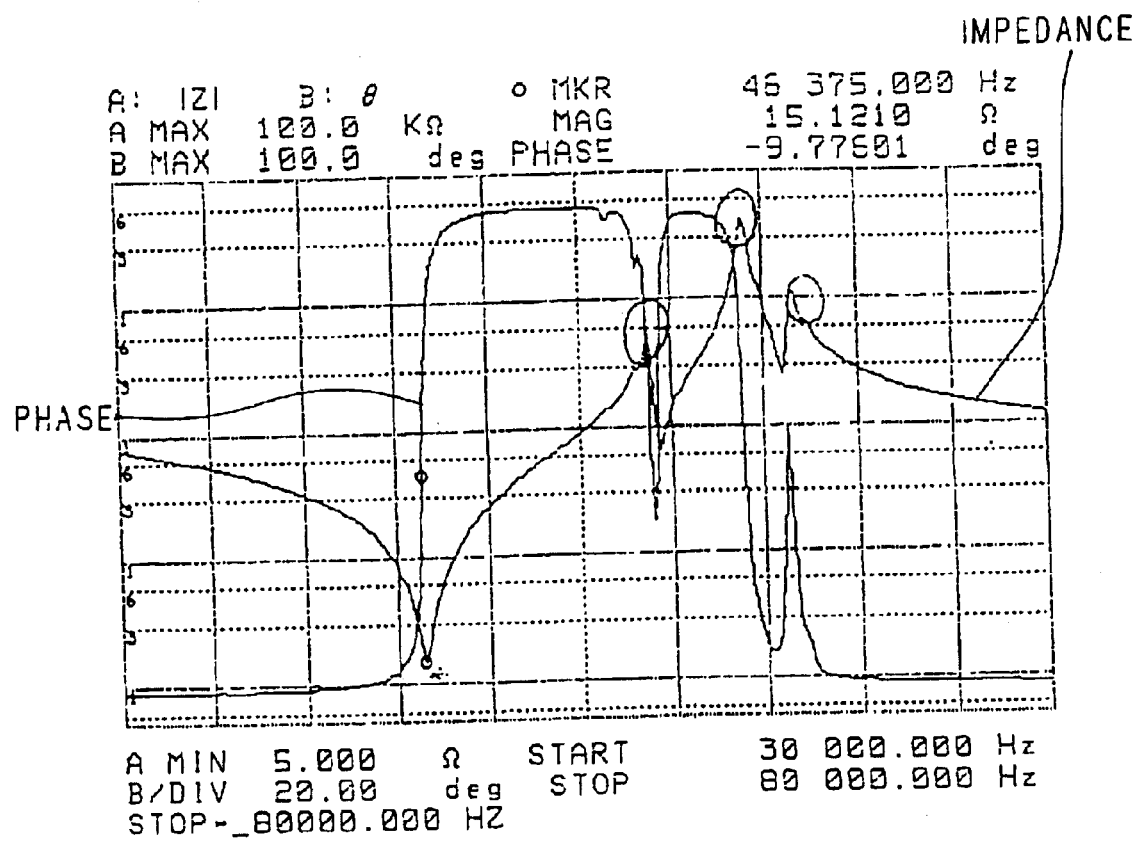
FIG. 6 is a diagram of an impedance curve and phase in $k_{31}$ vibration mode.
Figure 7:
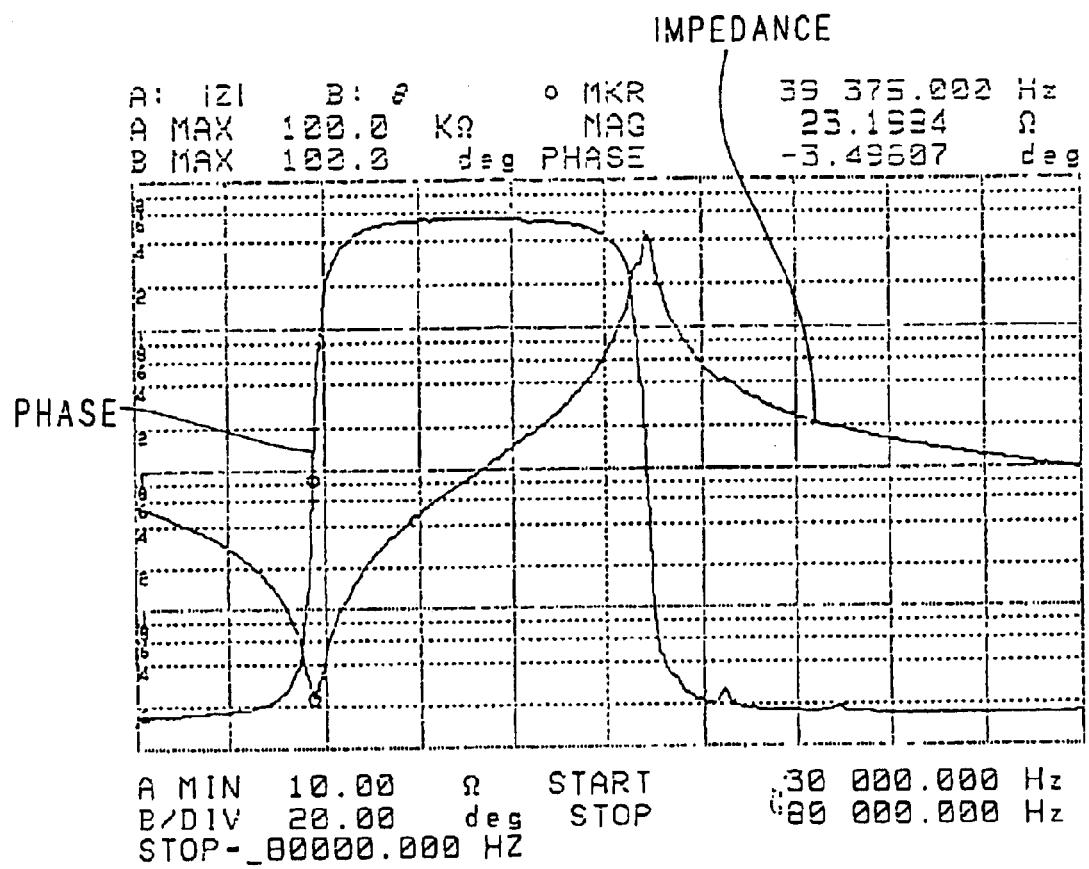
FIG. 7 is a diagram of an impedance curve and phase in $k_{31}$ vibration mode.
Figure 8:
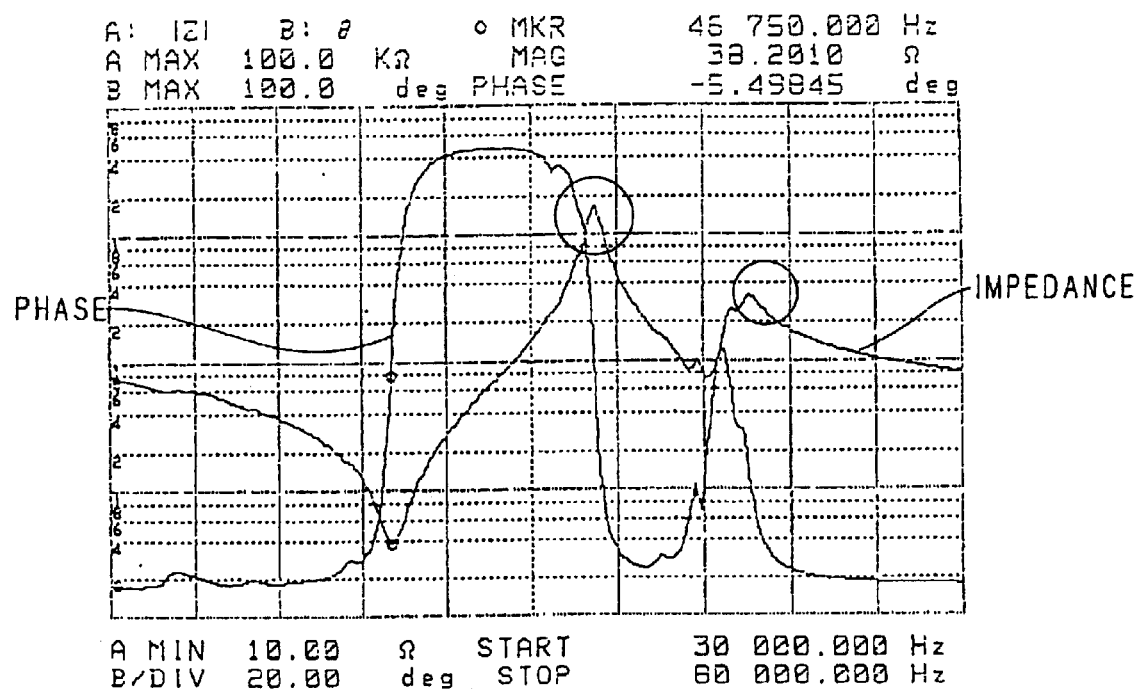
FIG. 8 is a diagram of an impedance curve and phase in $k_{31}$ vibration mode.
Figure 12:
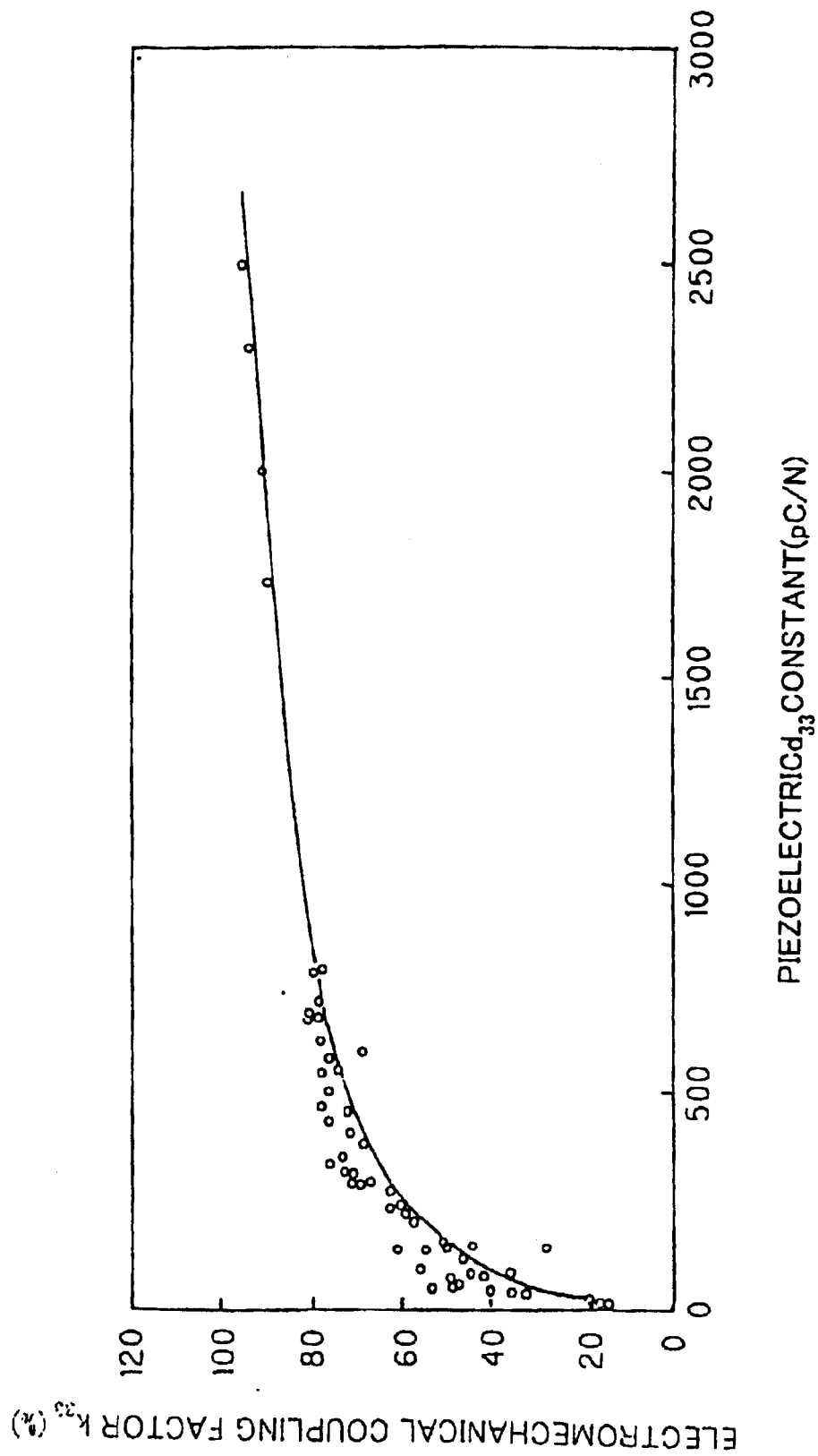
FIG. 12 is a $k_{33}$ vs. $d_{33}$ graph.

A method of controlling the mode of polarization direction will now be discussed referring to some examples. Table 1 shows the dielectric/piezoelectric characteristics of the single crystals in case where the polarization conditions or the like for prior arts (sample Nos. 1, 2 and 3), document values (document values 1 and 2) and the piezoelectric single crystal material according to the invention are varied. The values of $d_{33}$ in Table 1 were measured by a $d_{33}$ meter (ZJ-3D type produced by Chugoku Kagakuin Seigaku Kenkyujyo). The $k_{33}$ values were computed from the $d_{33}$ vs $k_{33}$ curve shown in FIG. 12 based on the measurements made by the present inventors. $k_{31}$, $d_{31}$, and $fc_{31}$ were computed from the frequency response of the impedance measured. FIGS. 4 through 8 illustrate impedance curves in $k_{31}$ mode after individual electric fields of 250 V/mm (sample No. 4), 500 V/mm (sample No. 5), 700 V/mm (sample No. 6), 1000 V/mm (sample No. 7) and 1600 V/mm (sample No. 8) were applied, for ten minutes between electrodes of a piezoelectric single crystal plate in use (device dimensions:13 mm long×4 mm wide ×0.36 mm thick) with 0.91PZN+0.09PT (X=0.91 expressed by a molar fraction) prepared by forming gold electrodes on two opposing (001) faces 11 of a crystal 10 by sputtering as shown in FIG. 3 and dipping the resultant structure in a silicon oil of 40° C. The polarization is insufficient in case of 250 V/mm (FIG. 4), and three responses regarding $k_{31}$ vibration modes are seen for 500 V/mm (FIG. 5) and 700 V/mm (FIG. 6), because there are multi domains in the direction perpendicular to the polarization direction.

(Table 1)

Figure 9:
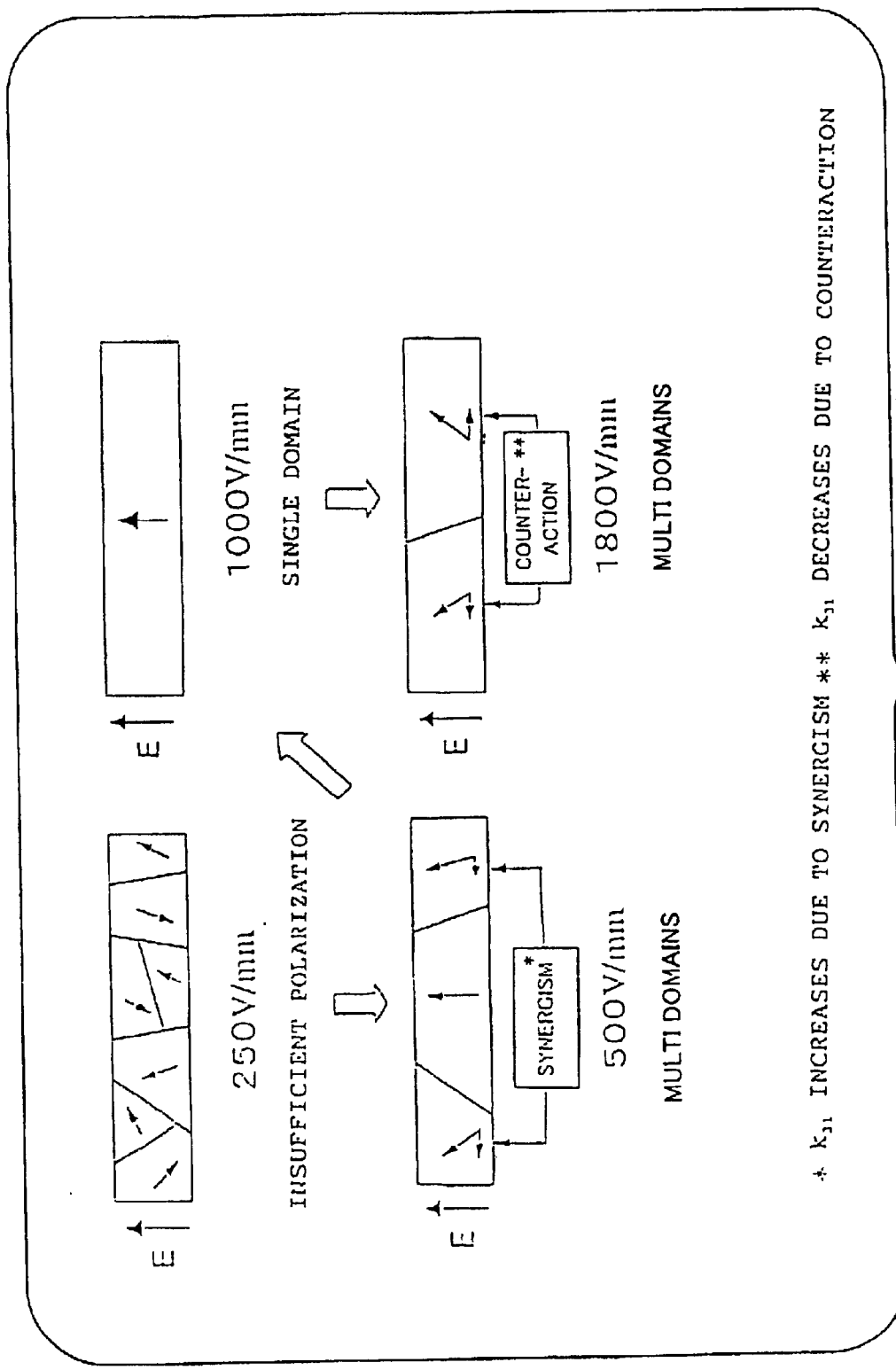
FIG. 9 is a diagram showing the state of a domain structure in a plane in the polarization direction (thickness direction) after application of an electric field.

For 1000 V/mm (FIG. 7), as apparent from the impedance curve, there is a single response, i.e., single domain in the direction perpendicular to the polarization direction and the $k_{31}$ value satisfies to be greater than 80% and $k_{33}$ in the direction parallel to the polarization direction shows a value over 95%. For 1600 V/mm (FIG. 8), dividing the single response into two or three responses, the domain is separated again into two or more domains and $k_{33}$ in the direction parallel to the polarization direction shows a value over 95% while the $k_{31}$ value is 61%. The value of the frequency constant $fc_{31}$ (=fr·L) which is a product of the resonance frequency fr in the lateral vibration mode relating to $k_{31}$ of each sample and the length L (13 mm long) of the piezoelectric single crystal in the vibration direction was 741 Hz·m for the sample No. 4, 601 Hz·m for the sample No. 5, 603 Hz·m for the sample No. 6, 522 Hz·m for the sample No. 7 and 700 Hz·m for the sample No. 8. FIG. 9 shows the state of the domain structure in a plane perpendicular to the polarization direction after application of electric fields of 250 V/mm, 500 V/mm, 1000 V/mm and 1600 V/mm.

In FIG. 9, while polarization is insufficient for 250 V/mm and there are multi domains for 500 V/mm, $k_{31}$ becomes larger due to the synergism of the polarization components relating to $k_{31}$. There is a single domain for 1000 V/mm and $k_{31}$ become maximum, and there are multi domains for 1600 V/mm, and $k_{31}$ becomes smaller due to the counteraction of the polarization components relating to $k_{31}$. In the invention, the domain layouts that would provide high $k_{33}$ ($d_{33}$) and high $k_{31}$ ($d_{31}$) were those for 500 V/mm and 1000 V/mm. When the temperature of the silicon oil was dropped to room temperature while applying a DC electric field of 400 V/mm to a piezoelectric single crystal with the same setting and the sample No. 9 in the silicon oil temperature of 200° C., the electromechanical coupling factor $k_{33}$ in the direction parallel to the polarization direction (longitudinal vibration mode) was equal to or greater than 80% and the electromechanical coupling factor $k_{31}$ in the direction perpendicular to the polarization direction (lateral vibration mode) was greater than 70%. The $fc_{31}$ at this time was 609 Hz·m. For the sample No. 10, a piezoelectric single crystal with the same setting was dipped into the silicon oil of 60° C., and a DC electric field of 400 V/mm was applied to the piezoelectric single crystal for 120 minutes. As a result, while the electromechanical coupling factor $k_{33}$ in the direction parallel to the polarization direction (longitudinal vibration mode) was greater than 95%, the electromechanical coupling factor $k_{31}$ in the direction perpendicular to the polarization direction (lateral vibration mode) was less than 30%.

For the sample No. 11, when a DC electric field of 1500 V/mm was applied to a piezoelectric single crystal with the same setting for 10 minutes, the electromechanical coupling factor $k_{33}$ in the direction parallel to the polarization direction (longitudinal vibration mode) was greater than 90% by contrast with the electromechanical coupling factor $k_{31}$ in the direction perpendicular to the polarization direction (lateral vibration mode) being less than 30%. $fc_{31}$ for the sample No. 10 and the sample No. 11 were respectively 981 Hz·m and 1004 Hz·m. It seems that the results have originated from the domain layout that suppress the lateral vibration.

By adequately setting the polarization conditions (applied voltage, temperature, etc.) this way, it is possible to control the domain state and the values of $k_{33}$ and $k_{31}$ that depend on the domain state. The invention is not limited to this embodiment, but it was confirmed that dielectric/piezoelectric characteristics similar to those of the embodiment described above could be acquired by using the temperature range, the polarization direction electric field range, the application time range and the application method for the step of applying a DC electric field of 400 V/mm to 1500 V/mm for a maximum of two hours in a temperature range of 20° C. to 200° C. or performing cooling while applying an electric field.

Further, with regard to the step of applying a DC electric field of 400 V/mm to 1500 V/mm for a maximum of two hours in a temperature range of 20° C. to 200° C. or performing cooling while applying an electric field, it was confirmed that the characteristics of the first aspect and second aspect of the invention were improved also by repeating the step of applying a DC electric field of 400 V/mm to 1500 V/mm for a maximum of two hours in a temperature range of 20° C. to 200° C. or performing cooling while applying an electric field with a depolarization step of holding at 200° C. higher than the Curie temperature for one hour in between. It was found that by arranging those results based on the frequency constant $fc_{31}$ (=fr·L), the product of electromechanical coupling factor $k_{31}$ in the direction perpendicular to the polarization direction (lateral vibration mode), the resonance frequency fr in $k_{31}$ mode and the length L of the piezoelectric single crystal in the vibration direction, a domain with high $k_{33}$ and high $k_{31}$ and a domain with high $k_{33}$ and low $k_{31}$ shown in FIG. 10 were obtained with the range of the value of the frequency constant $fc_{31}$ (=fr·L) on the horizontal axis in FIG. 10.

Figure 10:
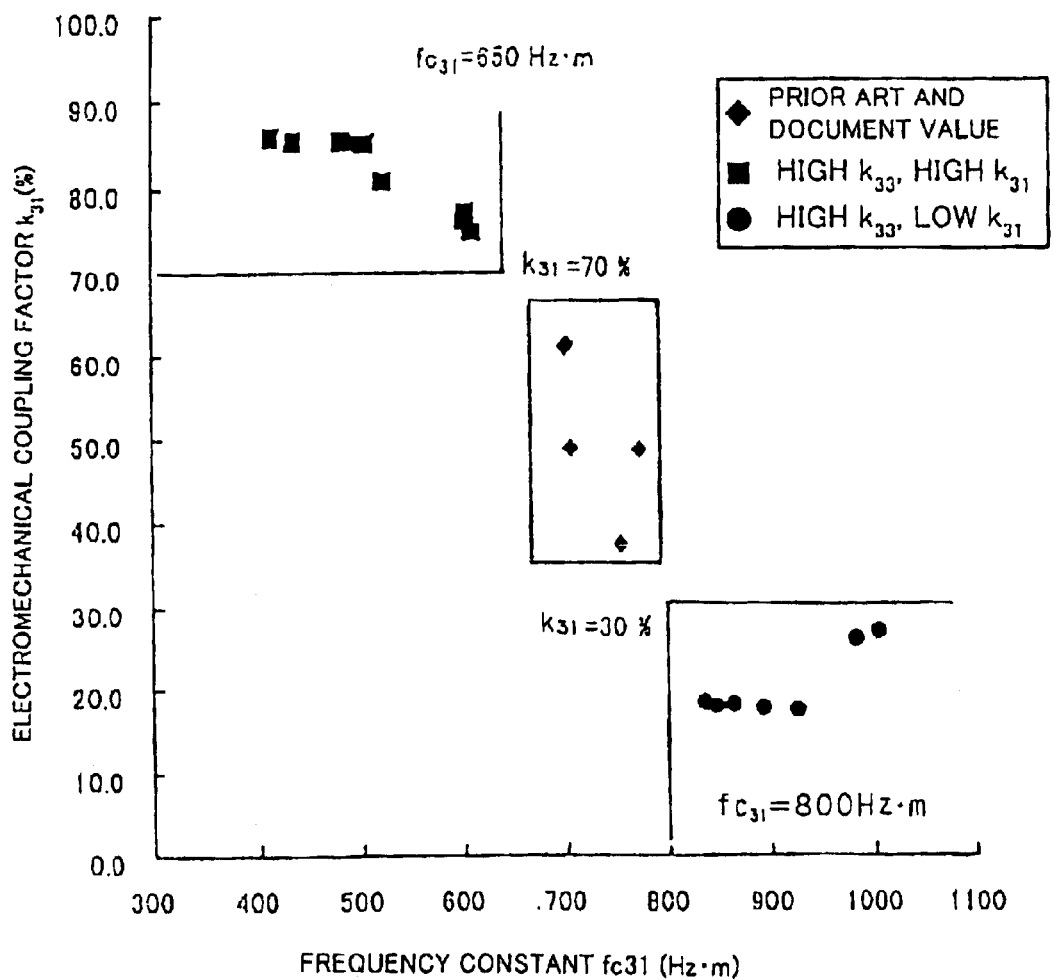
FIG. 10 is a graph of the values of an electromechanical coupling factor $k_{31}$ and a frequency constant ($fc_{31}=fr \cdot L$) which is the product of a resonance frequency fr in $k_{31}$ vibration mode and the length (L) of the piezoelectric single crystal in a vibration direction.

The prior arts and the document values are also given in FIG. 10. According to the prior arts and the document values, the frequency constant $fc_{31}$ (=fr·L) which is the product of the resonance frequency fr in $k_{31}$ mode and the length L of the piezoelectric single crystal in the vibration direction lies between the values given in appended claims 1 and 2. It seems that, as clarified in the foregoing description of the invention, the $k_{31}$ value varies because the domain control in the direction perpendicular to the polarization direction is insufficient.

Referring now to Table 2, a description will be given of an embodiment in which a step of applying an electric field in the direction perpendicular to the polarization direction of a piezoelectric single crystal and controlling the direction of the ferroelectric domain structure in the direction perpendicular to the polarization direction, a step (1) of heating and cooling a piezoelectric single crystal material with a temperature of transition between a rhombohedral crystal which is in a low temperature phase of the piezoelectric single crystal and a tetragonal crystal which is in an intermediate temperature phase of the piezoelectric single crystal material in between, or a step (2) of heating and cooling the piezoelectric single crystal material between a Curie temperature $T_c$ and a rhombohedral crystal in the low temperature phase or a tetragonal crystal in intermediate temperature phase, or a step (3) of heating and cooling the piezoelectric single crystal material in a high temperature phase equal to or higher than the $T_c$, or a step (4) of adequately combining the steps (1), (2) and (3) was carried out, followed by a step of applying a DC electric field of 400 V/mm to 1500 V/mm for a maximum of two hours in a temperature range of 20° C. to 200° C. or performing cooling while applying an electric field. The measurement of $d_{33}$, the computation of the $k_{33}$ value, and the measurement and computation of $k_{31}$, $d_{31}$ and $fc_{31}$ in Table 2 are similar to those in Table 1.

Figure 11:
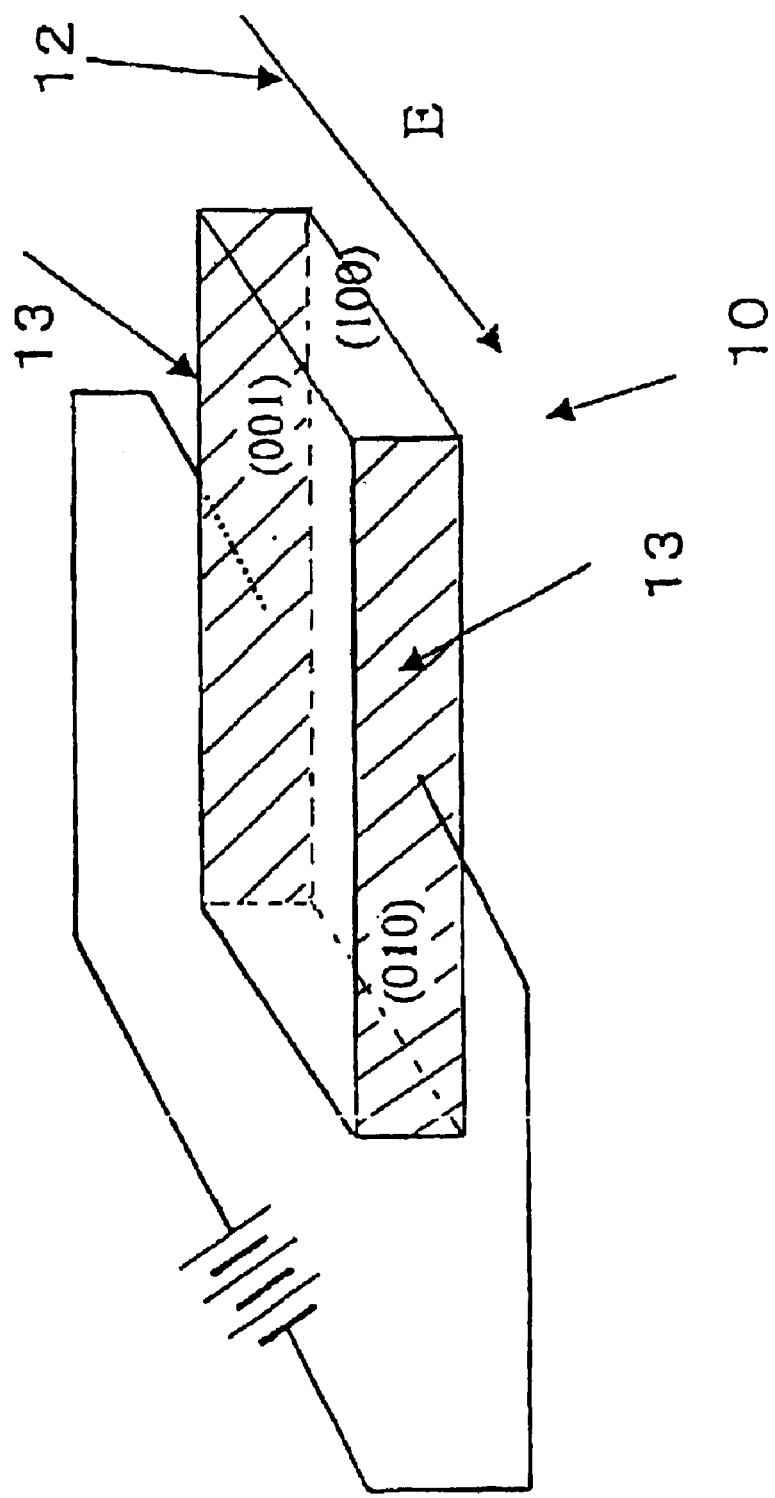
FIG. 11 is an explanatory diagram of application of an electric field.

For the sample No. 12, before the step of applying a DC electric field of 400 V/mm to 1500 V/mm for a maximum of two hours in a temperature range of 20° C. to 200° C. or performing cooling while applying an electric field, gold electrodes were formed on two (010) faces 13 of a piezoelectric single crystal of the same shape with that of the aforementioned single crystal, which were opposite to each other and were perpendicular to the (001) faces 11 in FIG. 3 by sputtering as shown in FIG. 11, a DC electric field of 1000 V/mm was applied to the resultant structure in the silicon oil of 40° C. for ten minutes for polarization. After the piezoelectric single crystal was removed from the silicon oil bath, the gold electrodes were removed by an etching solution and gold electrodes are further formed on the two opposing (001) faces 11 shown in FIG. 3 by sputtering, the step of applying a DC electric field of 400 V/mm to 1500 V/mm for a maximum of two hours in a temperature range of 20° C. to 200° C. indicated in the above-described embodiment or performing cooling while applying an electric field was carried out, and then the dielectric/piezoelectric characteristics were measured.

As a result, the electromechanical coupling factor $k_{33}$ of 97.3% in the direction parallel to the polarization direction (longitudinal vibration mode) and the piezoelectric constant $d_{33}$ of 2810 pC/N were obtained as shown in the sample No. 12 in Table 2. Further, the electromechanical coupling factor $k_{31}$ of 85.5% in the direction perpendicular to the polarization direction (lateral vibration mode) and the piezoelectric constant $d_{31}$ of −2380 pC/N were obtained. The value of the frequency constant $fc_{31}$ (=fr·L) which is a product of the resonance frequency fr in the lateral vibration mode in the direction perpendicular to the polarization direction relating to $k_{31}$ and the length L of the device in the vibration direction was 483 Hz·m.

For the sample Nos. 13, 14 and 15, before the step of applying a DC electric field of 400 V/mm to 1500 V/mm for a maximum of two hours in a temperature range of 20° C. to 200° C. or performing cooling while applying an electric field, piezoelectric single crystals of the same shapes with that of the aforementioned single crystal were dipped in the silicon oil, and temperature increasing and decreasing were repeated three times in a cycle of 30 minutes in the temperature ranges of 50 to 90° C. and 150 to 200° C. in the silicon oil and further in the temperature range of 200 to 400° C. in an electric oven. Thereafter, gold electrodes were formed on two opposing (001) faces 11 shown in FIG. 3 by sputtering, a step of applying a DC electric field of 400 V/mm to 1500 V/mm to the resultant structure in the temperature range of 20° C. to 200° C. indicated in the above-described embodiment for a maximum of two hours or performing cooling while applying an electric field was carried out, and then the dielectric/piezoelectric characteristics were measured. As a result, the electromechanical coupling factor $k_{33}$ of 97.5% in the direction parallel to the polarization direction (longitudinal vibration mode) and the piezoelectric constant $d_{33}$ of 2840 pC/N were obtained for the sample No. 13.

The electromechanical coupling factor $k_{31}$, of 85.3% in the direction perpendicular to the polarization direction (lateral vibration mode) and the piezoelectric constant $d_{31}$ of −2360 pC/N were obtained. For the sample No. 14, the electromechanical coupling factor $k_{33}$ of 97.8% in the direction parallel to the polarization direction (longitudinal vibration mode) and the piezoelectric constant $d_{33}$ of 2880 pC/N were obtained.

The electromechanical coupling factor $k_{31}$ of 85.3% in the direction perpendicular to the polarization direction (lateral vibration mode) and the piezoelectric constant $d_{31}$ of −2350 pC/N were obtained. For the sample No. 15, the electromechanical coupling factor $k_{33}$ of 97.4% in the direction parallel to the polarization direction (longitudinal vibration mode) and the piezoelectric constant $d_{33}$ of 2820 pC/N were obtained. The electromechanical coupling factor $k_{31}$ of 85.6% in the direction perpendicular to the polarization direction (lateral vibration mode) and the piezoelectric constant $d_{31}$ of −2380 pC/N were obtained. The frequency constant $fc_{31}$ (=fr·L) was 503 Hz·m for the sample No. 13, was 506 Hz·m for the sample No. 14 and was 437 Hz·m for the sample No. 15, respectively.

For the sample No. 16, gold electrodes were formed on two opposing (010) faces 13 perpendicular to the (001) faces 11 in FIG. 3 were formed by sputtering as shown in FIG. 11, the piezoelectric single crystal was dipped in the silicon oil, and a DC electric field of 400 V/mm was applied while repeating temperature increasing and decreasing were repeated three times in a cycle of 30 minutes in the temperature range of 150 to 200° C. After the piezoelectric single crystal was removed from the silicon oil bath, the gold electrodes were removed by an etching solution and gold electrodes are further formed on the two opposing (001) faces 11 shown in FIG. 3 by sputtering, the step of applying a DC electric field of 400 V/mm to 1500 V/mm for a maximum of two hours in a temperature range of 20° C. to 200° C. or performing cooling while applying an electric field was carried out, and then the dielectric/piezoelectric characteristics were measured. As a result, the electromechanical coupling factor $k_{33}$ of 97.8% in the direction parallel to the polarization direction (longitudinal vibration mode) and the piezoelectric constant $d_{33}$ of 2870 pC/N were obtained. Further, the electromechanical coupling factor $k_{31}$ of 86.0% in the direction perpendicular to the polarization direction (lateral vibration mode) and the piezoelectric constant $d_{31}$ of −2450 pC/N were obtained. The value of the frequency constant $fc_{31}$ (=fr·L) was 415 Hz·m.

It was confirmed that the same advantages were obtained even if the step of applying a DC electric field of 400 V/mm to 1500 V/mm for a maximum of two hours in a temperature range of 20° C. to 200° C. or performing cooling while applying an electric field after a DC electric field was applied between the (100) faces in FIG. 11 as another opposing faces perpendicular to the (001) faces in FIG. 3.

Figure 13:
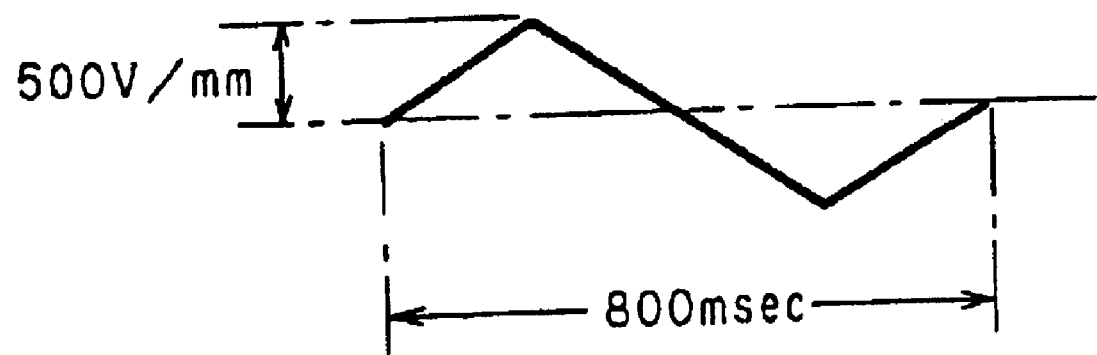
FIG. 13 is a waveform diagram of a bipolar triangular pulse.

For the sample No. 17, before the step of applying a DC electric field of 400 V/mm to 1500 V/mm for a maximum of two hours in a temperature range of 20° C. to 200° C. or performing cooling while applying an electric field, gold electrodes were formed on two (010) faces 13 of a piezoelectric single crystal of the same shape with that of the aforementioned single crystal, which were opposite to each other and were perpendicular to the (001) faces 11 in FIG. 3 by sputtering as shown in FIG. 11, a bipolar triangular electric field with a peak value of 500 V/mm and a period of 800 msec was applied to the resultant structure in the silicon oil of 60° C. for ten minutes. FIG. 13 shows the bipolar triangular waveform. After the piezoelectric single crystal was removed from the silicon oil bath, the gold electrodes were removed by an etching solution and gold electrodes are further formed on the two opposing (001) faces 11 shown in FIG. 3 by sputtering, the step of applying a DC electric field of 400 V/mm to 1500 V/mm for a maximum of two hours in a temperature range of 20° C. to 200° C. or performing cooling while applying an electric field was carried out, and then the dielectric/piezoelectric characteristics were measured. As a result, the electromechanical coupling factor $k_{33}$ of 97.1% in the direction parallel to the polarization direction (longitudinal vibration mode) and the piezoelectric constant $d_{33}$ of 2780 pC/N were obtained. Further, the electromechanical coupling factor $k_{31}$ of 18.3% in the direction perpendicular to the polarization direction (lateral vibration mode) and the piezoelectric constant $d_{31}$ of −230 pC/N were obtained. The value of the frequency constant $fc_{31}$ (=fr·L) was 863 Hz·m.

For the sample Nos. 18, 19 and 20, before the step of applying a DC electric field of 400 V/mm to 1500 V/mm for a maximum of two hours in a temperature range of 20° C. to 200° C. or performing cooling while applying an electric field, piezoelectric single crystals of the same shapes with that of the aforementioned single crystal were dipped in the silicon oil, and temperature increasing and decreasing were repeated three times in a cycle of 5 minutes in the temperature ranges of 50 to 90° C., 150 to 200° C. in the silicon oil bath and 200 to 400° C. in the electric oven. Thereafter, gold electrodes were formed on two opposing (001) faces 11 shown in FIG. 3 by sputtering, a step of applying a DC electric field of 400 V/mm to 1500 V/mm to the resultant structure in the temperature range of 20° C. to 200° C. indicated in the above-described embodiment for a maximum of two hours or performing cooling while applying an electric field was carried out, and then the dielectric/piezoelectric characteristics were measured.

As a result, for the sample No. 18, the electromechanical coupling factor $k_{33}$ of 97.0% in the direction parallel to the polarization direction (longitudinal vibration mode) and the piezoelectric constant $d_{33}$ of 2760 pC/N were obtained. Further, the electromechanical coupling factor $k_{31}$ of 18.6% in the direction perpendicular to the polarization direction (lateral vibration mode) and the piezoelectric constant $d_{31}$ of −260 pC/N were obtained. For the sample No. 19, the electromechanical coupling factor $k_{33}$ of 97.3% in the direction parallel to the polarization direction (longitudinal vibration mode) and the piezoelectric constant $d_{33}$ of 2810 pC/N were obtained. Further, the electromechanical coupling factor $k_{31}$ of 17.8% in the direction perpendicular to the polarization direction (lateral vibration mode) and the piezoelectric constant $d_{31}$ of −190 pC/N were obtained.

For the sample No. 20, the electromechanical coupling factor $k_{33}$ of 97.2% in the direction parallel to the polarization direction (longitudinal vibration mode) and the piezoelectric constant $d_{33}$ of 2790 pC/N were obtained. Further, the electromechanical coupling factor $k_{31}$ of 18.2% in the direction perpendicular to the polarization direction (lateral vibration mode) and the piezoelectric constant $d_{31}$ of −220 pC/N were obtained respectively. The frequency constant $fc_{31}$ (=fr·L) was 836 Hz·m for the sample No. 18, was 892 Hz·m for the sample No. 19 and was 847 Hz·m for the sample No. 20, respectively.

For the sample No. 21, gold electrodes were formed on two opposing (010) faces 13 perpendicular to the (001) faces 11 in FIG. 3 by sputtering as shown in FIG. 11, the piezoelectric single crystal was dipped in the silicon oil, and a DC electric field of 400 V/mm was applied while repeating temperature increasing and decreasing were repeated three times in a cycle of 5 minutes in the temperature range of 150 to 200° C. After the piezoelectric single crystal was removed, the gold electrodes were removed by an etching solution and gold electrodes are further formed on the two opposing (001) faces 11 shown in FIG. 3 by sputtering, the step of applying a DC electric field of 400 V/mm to 1500 V/mm for a maximum of two hours in a temperature range of 20° C. to 200° C. or performing cooling while applying an electric field was carried out, and then the dielectric/piezoelectric characteristics were measured. As a result, the electromechanical coupling factor $k_{33}$ of 97.7% in the direction parallel to the polarization direction (longitudinal vibration mode) and the piezoelectric constant $d_{33}$ of 2850 pC/N were obtained. Further, the electromechanical coupling factor $k_{31}$ of 17.6% in the direction perpendicular to the polarization direction (lateral vibration mode) and the piezoelectric constant $d_{31}$ of −150 pC/N were obtained. The value of the frequency constant $fc_{31}$ (=fr·L) was 924 Hz·m.

As the method of controlling the aligned state of ferroelectric domains perpendicular to the polarization direction by applying an electric field in the direction perpendicular to the polarization direction before the step of final polarization of the domain controlled piezoelectric single crystal, i.e., the step of applying a DC electric field of 400 V/mm to 1500 V/mm for a maximum of two hours in a temperature range of 20° C. to 200° C. or performing cooling while applying an electric field, the method of controlling the aligned state of ferroelectric domains perpendicular to the polarization direction by carrying out the step (1) of heating and cooling a piezoelectric single crystal material with a temperature of transition between a rhombohedral crystal which is in a low temperature phase of the piezoelectric single crystal and a tetragonal crystal which is in an intermediate temperature phase of the piezoelectric single crystal material in between, or the step (2) of heating and cooling the piezoelectric single crystal material between a Curie temperature $T_c$ (the piezoelectric single crystal material becomes cubic over the $T_c$ with the disappearance of the ferroelectricity) and a rhombohedral crystal in the low temperature phase or a tetragonal crystal in the intermediate temperature phase, or the step (3) of heating and cooling the piezoelectric single crystal material in high temperature phase equal to or higher than the $T_c$, or the step (4) of adequately combining the steps (1), (2) and (3), and the method of controlling the aligned state of ferroelectric domains perpendicular to the polarization direction by carrying out both the step of applying an electric field in the direction perpendicular to the polarization direction of the piezoelectric single crystal and the step of heating and cooling the single crystal piezoelectric device are executed, multi domains in the crystal to be produced in the gradual cooling process at the time of growing the crystal are controlled more based on human efforts. As confirmed, those methods were effective to more easily control the domain structure in the direction perpendicular to the polarization direction in the step of final polarization of a domain controlled piezoelectric single crystal for fabricating the domain controlled piezoelectric single crystal and to improve the dielectric/piezoelectric characteristics as mentioned in the foregoing description of the first and second aspects of the invention.

As the domain controlled piezoelectric single crystal according to the invention has the above-described structure and the method of fabricating the same comprises the above-described steps, it is possible to fabricate a piezoelectric single crystal which effectively uses the electromechanical coupling factor $k_{31}$ in case where the electromechanical coupling factor $k_{33}$ in the direction parallel to the polarization direction (longitudinal vibration mode) is equal to or greater than 80%, a piezoelectric constant $d_{33}$ is equal to or greater than 800 pC/N, the electromechanical coupling factor $k_{31}$ is equal to or greater than 70% and a piezoelectric constant $-d_{31}$ is equal to or greater than 1200 pC/N ($d_{31}$ having a negative value by definition), and it is possible to use the value of $k_{33}$ more efficiently due to generation of no spurious (undesired vibration) or the like in the band of usage of that value in case where $k_{33}$ is equal to or greater than 80%, $d_{33}$ is equal to or greater than 800 pC/N, $k_{31}$ is equal to or smaller than 30% and $-d_{31}$ is equal to or smaller than 300 pC/N ($d_{31}$ having a negative value by definition).

TABLE 1

| | Polarization conditions | | | Dielectric/piezoelectric characteristics | | | | | Adapted |
| --- | --- | --- | --- | --- | --- | --- | --- | --- | --- |
| Sample No. | Temperature ° C. | Electric field E V/mm | Time min | $k_{33}$ % | $d_{33}$ $10^{-12}$ C/N | $k_{31}$ % | $d_{31}$ $10^{-12}$ C/N | $fc_{31}$ Hz · m | claims or the like |
| 1 | 20 | 1800 | 10 | 95.6 | 2550 | 61.5 | −970 | 701 | Prior art |
| 2 | 60 | 400 | 150 | 95.3 | 2500 | 48.7 | −694 | 773 | Prior art |
| 3 | 100 | 300 | 120 | 94.0 | 2360 | 35.0 | −520 | 755 | Prior art |
| 4 | 40 | 250 | 10 | 56.0 | 165 | 18.9 | −224 | 741 | insufficient polarization |
| 5 | 40 | 500 | 10 | 84.0 | 1190 | 76.0 | −1310 | 601 | Claim 1 |
| 6 | 40 | 700 | 10 | 87.0 | 1420 | 77.1 | −1324 | 603 | Claim 1 |
| 7 | 40 | 1000 | 10 | 95.3 | 2500 | 80.8 | −1701 | 522 | Claim 1 |
| 8 | 40 | 1600 | 10 | 95.3 | 2500 | 60.9 | −939 | 700 | Claim 1 |
| 9 | 200 | 400 | Field cooling | 80.2 | 960 | 74.7 | −1263 | 609 | Claim 1 |
| 10 | 60 | 400 | 120 | 96.9 | 2740 | 26.3 | −288 | 981 | Claim 2 |
| 11 | 20 | 1500 | 10 | 94.6 | 2300 | 27.1 | −291 | 1004 | Claim 2 |
| Document value 1 | | | | 94 | 2300 | 53 | −1100 | — | |
| Document value 2 | | | | 90 | 1734 | 49 | −962 | 680–733 (average value: 707) | |

TABLE 2

| Sample No. | Process contents | Conditions | Dielectric/piezoelectric characteristics | | | | | Adapted claims or the like |
|---|---|---|---|---|---|---|---|---|
| | | | $k_{33}$ % | $d_{33}$ $10^{-12}$ C/N | $k_{31}$ % | $d_{31}$ $10^{-12}$ C/N | $fc_{31}$ Hz·m | |
| 12 | Claim 5 | DC electric field 1000 V/mm, 40° C., 10 min | 97.3 | 2810 | 85.5 | −2380 | 483 | Claim 1 |
| 13 | Claim 6 | 50–90° C., cycle of 30 min, repeated 3 times | 97.5 | 2840 | 85.3 | −2360 | 503 | Claim 1 |
| 14 | Claim 6 | 150–200° C., cycle of 30 min, repeated 3 times | 97.8 | 2880 | 85.3 | −2350 | 506 | Claim 1 |
| 15 | Claim 6 | 200–400° C., cycle of 30 min, repeated 3 times | 97.4 | 2820 | 85.6 | −2380 | 437 | Claim 1 |
| 16 | Claim 7 | DC electric field 400 V/mm, 150–200° C., cycle of 30 min, repeated 3 times | 97.8 | 2870 | 86.0 | −2450 | 415 | Claim 1 |
| 17 | Claim 5 | bipolar triangular wave 500 V/mm, cycle 800 ms, 10 min | 97.1 | 2780 | 18.3 | −230 | 863 | Claim 2 |
| 18 | Claim 6 | 50–90° C., cycle of 5 min, repeated 3 times | 97.0 | 2760 | 18.6 | −260 | 836 | Claim 2 |
| 19 | Claim 6 | 150–200° C., cycle of 5 min, repeated 3 times | 97.3 | 2810 | 17.8 | −190 | 892 | Claim 2 |
| 20 | Claim 6 | 200–400° C., cycle of 5 min, repeated 3 times | 97.2 | 2790 | 18.2 | −220 | 847 | Claim 2 |
| 21 | Claim 7 | DC electric field 400 V/mm, 150–200° C., cycle of 5 min, repeated 3 times | 97.7 | 2850 | 17.6 | −150 | 924 | Claim 2 |

What is claimed is:

1. A domain controlled piezoelectric single crystal having an electromechanical coupling factor $k_{33} \geq 80\%$ in a longitudinal vibration mode in the direction parallel to a polarization direction and a piezoelectric constant $d_{33} \geq 800$ pC/N, comprising, an electromechanical coupling factor $k_{31} \geq 70\%$ in a lateral vibration mode in a direction perpendicular to said polarization direction, a piezoelectric constant $-d_{31}$ 1200 pC/N and a frequency constant $fc_{31}$ (=fr·L) $\leq 650$ Hz·m which is a product of a resonance frequency fr in said lateral vibration mode in said direction perpendicular to said polarization direction relating to $k_{31}$ and a length L of said piezoelectric single crystal in a vibration direction.

2. The domain controlled piezoelectric single crystal according to claim 1, wherein said piezoelectric single crystal material is either one of following materials (a) and (b):

(a) a solid solution which is comprised of X-Pb ($A_1$, $A_2$, ..., $B_1$, $B_2$, ...) $O_3$+(1−X)PbTiO$_3$(0<X<1) where $A_1$, $A_2$, ... are one or plural elements selected from a group of Zn, Mg, Ni, Lu, In and Sc and $B_1$, $B_2$, ... are one or plural elements selected from a group of Nb, Ta, Mo and W, and in which a sum ω of valencies of elements in parentheses in a chemical formula Pb($A_{1Y1}{}^{a1}$, $A_{2Y2}{}^{a2}$, ..., $B_{1Z1}{}^{b1}$, $B_{1Z2}{}^{b2}$, ...)$O_3$ satisfies charges of $\omega = a_1 \cdot Y_1 + a_2 \cdot Y_2 + ... b_1 \cdot Z_1 + b_2 \cdot Z_2 + ... = 4+$ where $a_1$, $a_2$, ... are valencies of $A_1$, $A_2$, ..., $b_1$, $b_2$, ... are valencies of $B_1$, $B_2$, ... and $Z_1$, $Z_2$, ... are composition ratios in said chemical formula, and (b) said material (a) added with 0.5 ppm to 1% by mass of one or two of Mn and Cr.

3. A domain controlled piezoelectric single crystal having an electromechanical coupling factor $k_{33} \geq 80\%$ in a longitudinal vibration mode in the direction parallel to a polarization direction and a piezoelectric constant $d_{33} \geq 800$ pC/N, comprising, an electromechanical coupling factor $k_{33} \leq 30\%$ in a lateral vibration mode in a direction perpendicular to said polarization direction, a piezoelectric constant $-d_{31} \leq 300$ pC/N and a frequency constant $fc_{31}$ (=fr·L) $\geq 800$ Hz·m which is a product of a resonance frequency fr in said lateral vibration mode in said direction perpendicular to said polarization direction relating to $k_{31}$ and a length L of said piezoelectric single crystal in a vibration direction.

4. The domain controlled piezoelectric single crystal according to claim 3, wherein said piezoelectric single crystal material is either one of following materials (a) and (b):

(a) a solid solution which is comprised of X-Pb ($A_1$, $A_2$, ..., $B_1$, $B_2$, ...) $O_3$+(1−X)PbTiO$_3$(0<X<1) where $A_1$, $A_2$, ... are one or plural elements selected from a group of Zn, Mg, Ni, Lu, In and Sc and $B_1$, $B_2$, ... are one or plural elements selected from a group of Nb, Ta, Mo and W, and in which a sum ω of valencies of elements in parentheses in a chemical formula Pb($A_{1Y1}{}^{a1}$, $A_{2Y2}{}^{a2}$, ..., $B_{1Z1}{}^{b1}$, $B_{1Z2}{}^{b2}$, ...)$O_3$ satisfies charges of $\omega = a_1 \cdot Y_1 + a_2 \cdot Y_2 + ... b_1 \cdot Z_1 + b_2 \cdot Z_2 + ... = 4+$ where $a_1$, $a_2$, ... are valencies of $B_1$, $B_2$, ... and $Z_1$, $Z_2$, ... are composition ratios in said chemical formula, and (b) said material (a) added with 0.5 ppm to 1% by mass of one or two of Mn and Cr.

* * * * *

UNITED STATES PATENT AND TRADEMARK OFFICE
CERTIFICATE OF CORRECTION

PATENT NO. : 6,756,238 B2
DATED : June 29, 2004
INVENTOR(S) : Toshio Ogawa et al.

It is certified that error appears in the above-identified patent and that said Letters Patent is hereby corrected as shown below:

Column 2,
Line 23, "factor $k_{33}$24 80%" with -- factor $k_{33} \geq 80\%$ --;

Column 13,
Line 30, "constant $-d31$ 1200 pC/N" with -- constant $-d31 \geq 1200$ pC/N --; and Column 14,
Line 26, "factor $k_{33} \leq 30\%$" with -- factor $k_{31} \leq 30\%$ --.

Signed and Sealed this

First Day of February, 2005

JON W. DUDAS
*Director of the United States Patent and Trademark Office*